United States Patent [19]

Kitagawa et al.

[11] Patent Number: 4,496,937

[45] Date of Patent: Jan. 29, 1985

[54] SAMPLED SIGNAL GENERATION CIRCUIT

[75] Inventors: Kazuo Kitagawa, Kawasaki; Kenjiro Endoh; Hideshi Kira, both of Yokohama, all of Japan

[73] Assignee: Tokyo Shibaura Denki Kabushiki Kaisha, Kawasaki, Japan

[21] Appl. No.: 485,135

[22] Filed: Apr. 20, 1983

Related U.S. Application Data

[62] Division of Ser. No. 273,401, Jun. 15, 1981, abandoned.

[30] Foreign Application Priority Data

| Jun. 20, 1980 [JP] | Japan | 55-83830 |
| Jun. 20, 1980 [JP] | Japan | 55-83831 |
| Nov. 20, 1980 [JP] | Japan | 55-163912 |
| Nov. 20, 1980 [JP] | Japan | 55-163916 |

[51] Int. Cl.³ .......................................... H03K 13/02
[52] U.S. Cl. ........................... 340/347 SH; 375/27; 340/347 AD; 358/138
[58] Field of Search .................. 358/260, 261, 138; 340/347 SH, 347 AD; 328/151; 381/29-35; 375/27-32

[56] References Cited

U.S. PATENT DOCUMENTS

| 2,978,535 | 4/1961 | Brown | 358/261 |
| 3,021,384 | 2/1962 | Brown | 358/138 |
| 3,324,237 | 6/1967 | Cherry | 340/347 SH UX |
| 4,222,008 | 9/1980 | Mezrich | 328/151 |
| 4,291,299 | 9/1981 | Hinz | 358/138 |
| 4,393,371 | 7/1983 | Morgan-Smith | 358/138 |

Primary Examiner—C. D. Miller
Attorney, Agent, or Firm—Oblon, Fisher, Spivak, McClelland & Maier

[57] ABSTRACT

A sampled data generation circuit includes a voltage controlled oscillator for producing an output signal with a frequency variable according to a control voltage, a sample and hold circuit for sampling and holding an analog input signal in response to the output signal from the voltage controlled oscillator, and a control circuit for detecting the difference between two successive sampled data generated from the sample and hold circuit and supplying the voltage controlled oscillator with an output signal corresponding to the difference as the control voltage, thereby controlling the voltage controlled oscillator so that the greater the difference, the higher the frequency of the output signal from the voltage controlled oscillator is.

4 Claims, 28 Drawing Figures

F I G. 17
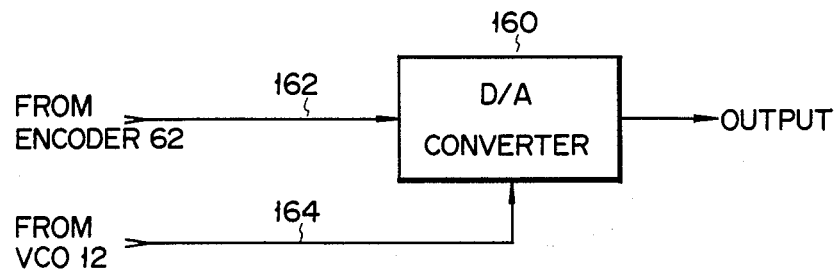
F I G. 18
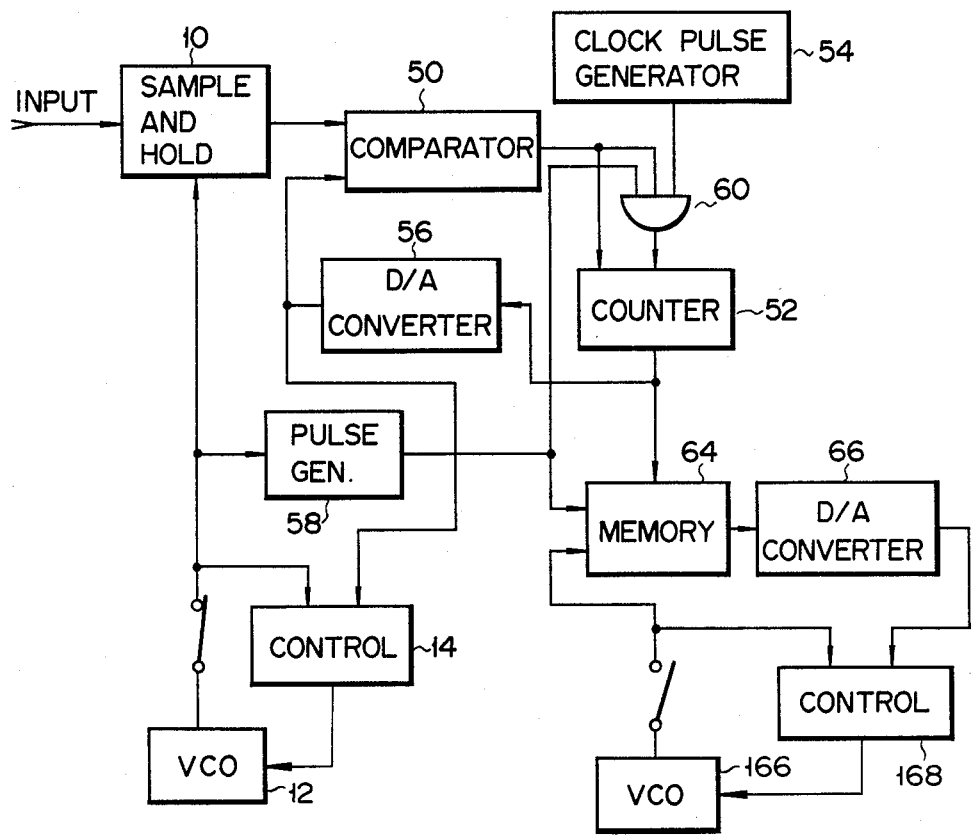

SAMPLED SIGNAL GENERATION CIRCUIT

This application is a division of application Ser. No. 273,401, filed June 15, 1981, abandoned.

This invention relates to a sampled signal generation circuit used in an analog-digital conversion device or the like.

In converting an analog signal into a digital signal by means of an analog-digital (A/D) converter, or in modulating an analog signal on the basis of the delta modulation, the input analog signal is sampled at a constant frequency. In a well-known sampling circuit, when, for example, an analog signal as shown in FIG. 1A is sampled in response to sampling pulses as shown in FIG. 1B a sampled signal as shown in FIG. 1C may be obtained. Similarly, when an analog signal of FIG. 1A is applied to an encoder for delta modulation, a delta modulated signal as shown in FIG. 1D is delivered from the encoder.

As is apparent from FIG. 1C, the variation of the analog input signal at each individual sampling interval is greater in a region where the rate of change of the input signal is high than in a region where the rate of change is low. Therefore, it is not correct to say that the sampled signal shown in FIG. 1C corresponds to the analog input signal shown in FIG. 1A with high fidelity. As is evident from FIG. 1D, moreover, the delta modulated signal obtained on the basis of the sampled signal shown in FIG. 1C will cause overslope distortion where the rate of change of the analog input signal is high.

The object of this invention is to provide a sampled signal generation circuit capable of producing a sampled signal corresponding to an analog input signal with high fidelity.

According to an aspect of this invention, there is provided a sampled signal generation circuit which comprises signal generating means with a frequency variable according to a control signal, data generating means for successively producing data in response to an output signal from the signal generating means, and control means for detecting the difference between two data generated from the data generating means and supplying the signal generating means with an output signal corresponding to the difference as the control signal, thereby controlling the signal generating means so that the greater the difference, the higher the frequency of the output signal from the signal generating means is.

According to another aspect of this invention, there is provided a sampled signal generation circuit which produces a sampled signal corresponding to an analog input signal and comprises signal generating means with a frequency variable according to a control signal, data generating means for successively producing data in response to an output signal from the signal generating means, and control means for detecting the gradient of an analog input signal and supplying the signal generating means with an output signal corresponding to the detected gradient as the control signal, thereby controlling the signal generating means so that the greater the detected gradient, the higher the frequency of the output signal from the signal generating means is.

According to this invention, a clock signal with higher sampling frequency is used in a case where the rate of change of the analog input signal is high, as compared with a case where the rate of change is low, so that a sampled signal representing the analog input signal with high fidelity can be obtained irrespective of the variation in the rate of change of the analog input signal.

This invention can be more fully understood from the following detailed description when taken in conjunction with the accompanying drawings, in which:

FIG. 17 is a connection diagram for illustrating the connection between the A/D converting circuit shown in FIGS. 7 or 13 and a D/A converter combined with the A/D converting circuit to form a data transmission circuit; and FIG. 18 shows a modification of the analog signal storing circuit shown in FIG. 8.

Referring first to FIGS. 2A to 2D, the principle of this invention will be described.

Figure 1A:
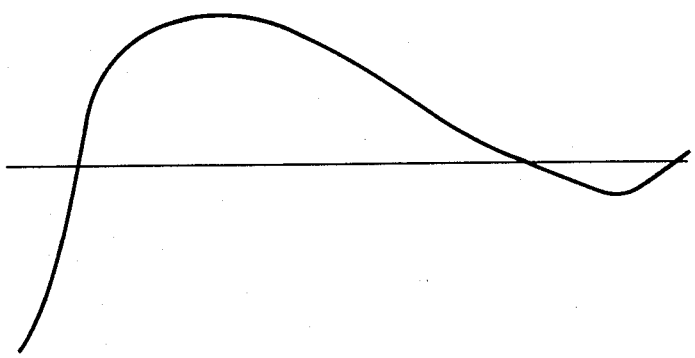
FIGS. 1A to 1D show signal waveforms for illustrating the operation of a prior art sampling circuit.
Figure 1B:
Figure 1C:
Figure 1D:
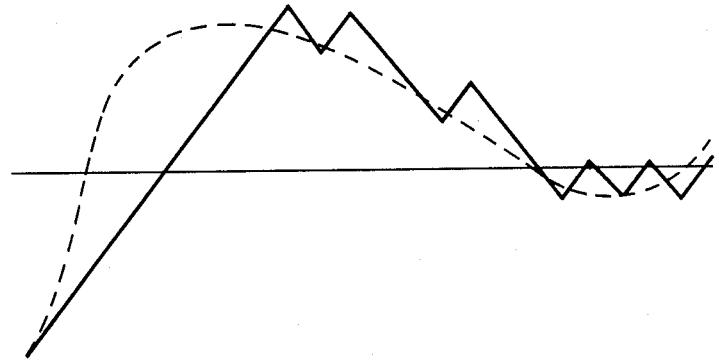
Figure 2A:
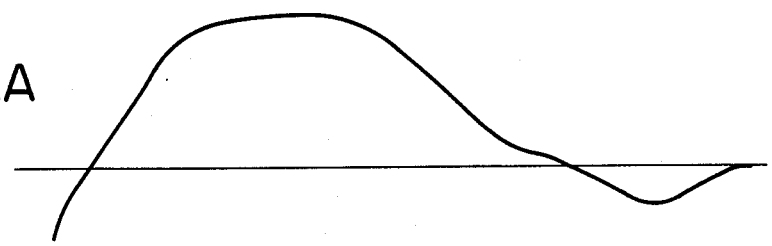
FIGS. 2A to 2D show signal waveforms for illustrating the operation of a sampled signal generation circuit according to this invention.
Figure 2B:
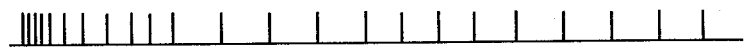
Figure 2C:
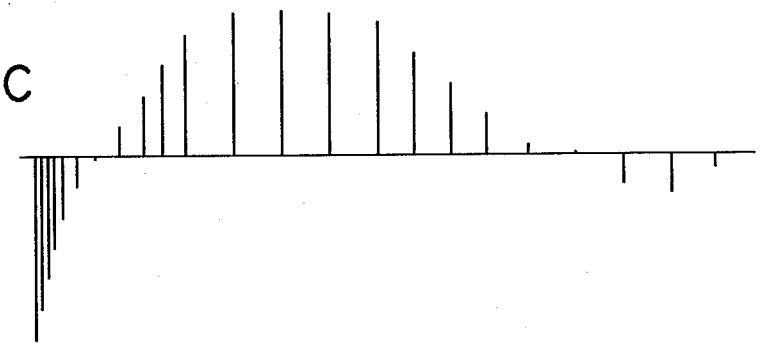
Figure 2D:
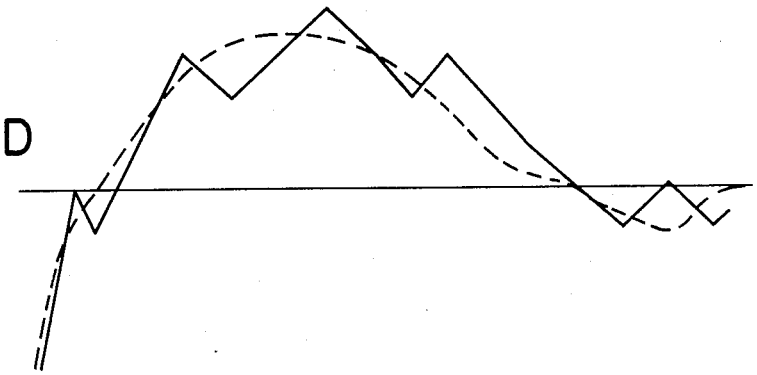

In a sampled signal generation circuit according to this invention, a sampled signal as shown in FIG. 2C may, for example, be obtained by sampling an analog signal as shown in FIG. 2A in response to sampling pulses whose frequency increases with the increase of the rate of change of the analog input signal, as shown in FIG. 2B. That is, in the sampled signal generation circuit of the invention, sampling is executed not at regular intervals along the time base of the input signal, but in accordance with the rate of change of the analog input signal. In a first sampling method, for example, the sampling timing is determined by the difference between two preceding sampled data obtained consecutively, and the greater the difference between the two sampled data, the shorter the sampling interval will be. These sampled data are stored in a memory directly or after they are converted into digital data by an A/D converter. In this case, the sampled data stored in the memory contain no time base information, so that it is essential to give time base information to the sampled data read out from the memory. This requirement may, for example, be fulfilled as follows.

If sampled data $SD(t_{i-1})$ and $SD(t_i)$ are obtained at sampling timings $t_{i-1}$ and $t_i$ respectively, the next sampling timing $t_{i+1}$ depends on the difference $\Delta SD$ between these sampled data $SD(t_{i-1})$ and $SD(t_i)$. In other words, the interval $\tau_i$ between the sampling timings $t_i$ and $t_{i+1}$ is primarily determined by the difference $\Delta SD$, and can be restored if a sampled data $SD(t_0)$ at a sampling timing $t_0$ and the initial sampling interval $\tau_0$ are given. For example, the sampling interval $\tau_i$ is given by the following equations:

$$\tau_i = \tau_{max} - a\Delta SD \quad (1)$$

$$\tau_i = \tau_{min} + \frac{c}{\Delta SD + b} \quad (2)$$

Here, a, b and c are constants, $\tau_{max}$ and $\tau_{min}$ are the maximum and minimum values of $\tau_i$, respectively.

Thus, the following sampled data is read out from the memory after a time interval corresponding to the difference between the two preceding sampled data, and in the end these sampled data are read out with information on the same sampling timing as encoding.

In a second sampling method, a subsequent sampling timing is determined by, for example, a gradient data $|dg(t)/dt|$ on the gradient of the analog input signal at the preceding sampling timing, and the greater the value of the gradient data, the shorter the sampling interval will be. For example, the sampling frequency f(t) is given by the following equation:

$$f(t) = a\,|dg(t)/dt| + b \quad (3)$$

where a and b are constants.

Assuming that the value of a gradient data is substantially constant during the interval $\tau_i$, then, the difference $\Delta SD_i$ between the two sampled data is given by the following equation:

$$|\Delta SD_i| = |dg(t_i)/dt_i| \times \tau_i \quad (4)$$

From eqs. (3) and (4), a sampling frequency $f(t_i)\,(=1/\tau_i)$ at the sampling timing $t_i$ is given by the following equation:

$$f(t_i) = b/(1 - a\,|\Delta SD_i|) \quad (5)$$

Thus, the sampling frequency can be primarily determined by the two successive sampled data, so that information on the sampling timing for the next sampled data can be obtained from the difference between the two sampled data successively read out from the memory.

On the basis of the above-mentioned principle, the analog input signal can be sampled in response to sampling pulses with controlled frequency, and the sampled data thus obtained can be read out with information on the sampling timing after they are once stored in the memory.

Now there will be described several embodiments of the sampled signal generation circuit of this invention with reference to the accompanying drawings.

Figure 3:
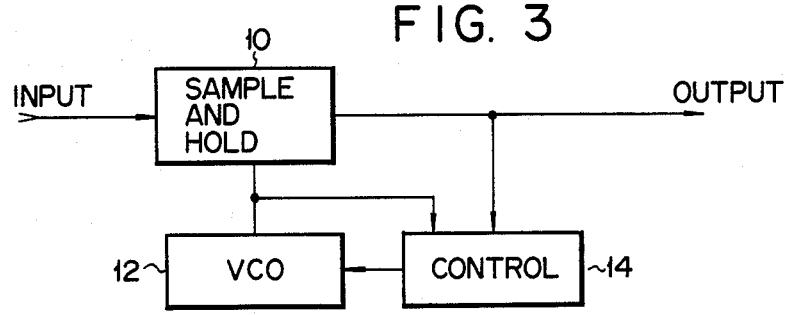
FIG. 3 is a block diagram of a sampled signal generation circuit according to an embodiment of the invention.
Figure 4:
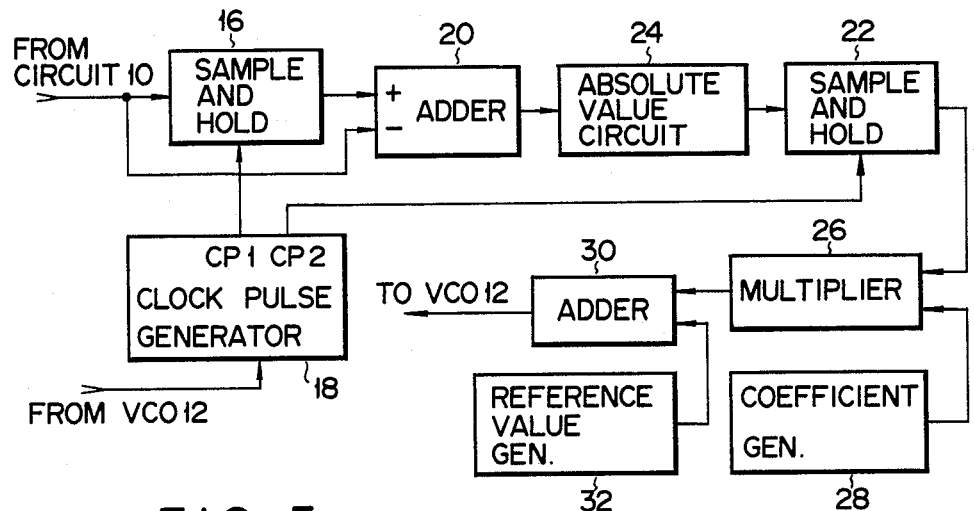
FIG. 4 is a detailed block diagram of a control circuit used in the sampled signal generation circuit shown in FIG. 3.

FIG. 3 shows an embodiment of the sampled signal generation circuit of the invention which includes a sample and hold circuit 10 for sampling and holding an analog input signal, a voltage controlled oscillator (VCO) 12 for supplying the sample and hold circuit 10 with sampling pulses, and a control circuit 14 for controlling the frequency of the sampling pulses from the VCO 12 in accordance with the sampled signal from the sample and hold circuit 10. As shown in FIG. 4, for example, the control circuit 14 controls the VCO 12 in accordance with the difference between two sampled data successively generated from the sample and hold circuit 10. The control circuit 14 shown in FIG. 4 includes a sample and hold circuit 16 for sampling and holding an output signal from the sample and hold circuit 10 in response to clock pulses CP1 which are generated from a clock pulse generator 18 with a predetermined time delay with respect to the sampling pulses from the VCO 12, an adder 20 for producing an output signal corresponding to the difference between output signals from the sample and hold circuits 10 and 16, and a sample and hold circuit 22 for sampling and holding a signal transmitted from the adder 20 through an absolute value circuit 24 in response to clock pulses CP2 which are generated from the clock pulse generator 18 with a slight time delay with respect to the sampling pulses from the VCO 12. An output signal from the sample and hold circuit 22 is multiplied in a multiplier 26 by a negative-value coefficient data K generated from a coefficient generator 28, the product is added by the adder 30 to a reference voltage $V_{REF}$ delivered from a reference value generator 32, and the sum is supplied to the control terminal of the VCO 12.

Figure 5:
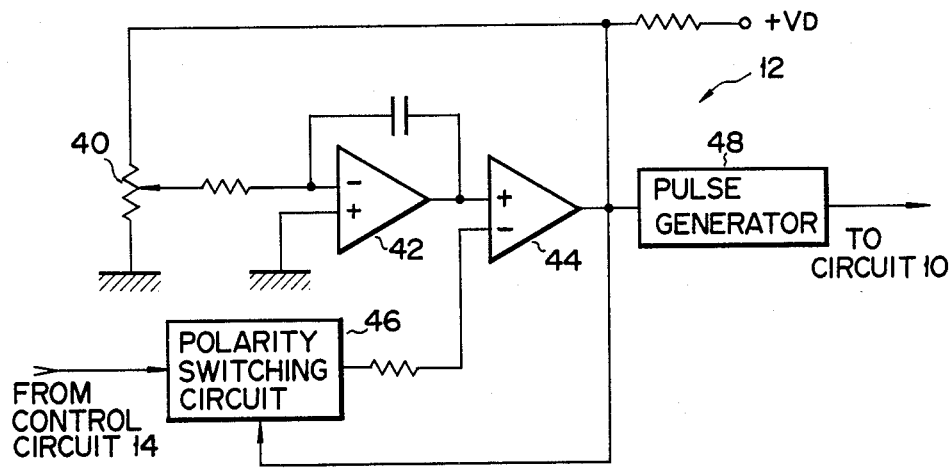
FIG. 5 is a circuit diagram of a voltage controlled oscillator used in the sampled signal generation circuit shown in FIG. 3.

FIG. 5 shows an example of the arrangement of the VCO 12. The VCO 12 includes a voltage divider 40 connected between a power source terminal $+V_D$ and the ground through a resistor, an integration circuit 42 for integrating output voltages from the voltage divider 40, and a comparing circuit 44 for comparing output signals from the integration circuit 42 and a polarity switching circuit 46. The output terminal of the comparing circuit 44 is connected to the voltage divider 40, the polarity switching circuit 46, and a pulse generator 48. The comparing circuit 44 produces an output voltage $+V_D$ when it detects that the output signal of the integration circuit 42 is higher than the output signal of the polarity switching circuit 46, and produces an output voltage $-V_D$ when the reverse is the case. The polarity switching circuit 46 inverts the polarity of a control voltage from the control circuit 14 (FIG. 3) to supply the comparing circuit 44 with an inverted voltage when the output signal of the comparing circuit 44 is positive.

Assume now that, in this VCO 12, the comparing circuit 44 is producing the output voltage $+V_D$. In this case, the integration circuit 42 integrates an output voltage $V_I$ from the voltage divider 40 to produce an output signal which is reduced with the passage of time t at the rate of $-(V_I/RC)t$ (R and C are values of resistor and capacitor in time constant circuit of the integration circuit 42 respectively). As for the polarity switching circuit 46, it inverts an output voltage $V_C$ from the control circuit 14 to supply the comparing circuit 44 with an output voltage $-V_C$. When the output voltage from the integration circuit 42 becomes lower than the voltage $-V_C$, the comparing circuit 44 produces an output voltage $-V_D$. As a result, the integration circuit 42 produces an output signal which rises with time at the rate of $(V_I/RC)t$. In this case, a negative voltage is generated from the comparing circuit 44, so that the polarity switching circuit 46 supplies the comparing circuit 44 directly with the output voltage $V_C$ from the control circuit 14 without inverting the same. When the output voltage of the integration circuit 42 rises and exceeds the voltage $V_C$, the comparing circuit 44 produces an output voltage $+V_D$. Thus, the output voltage $+V_D$ and $-V_D$ are alternately generated from the comparing circuit 44, this period of time being proportional to $V_C$, and given by equation $2RC(V_C/V_I)$, and the pulse generator 48 produces output pulses in response to the output voltage from the comparing circuit 44 at the level change of the output voltage. In consequence, the lower the output voltage from the control circuit 14, that is, the greater the difference between two successive sampled data, the higher the pulse rate at which the output pulses are generated from the pulse generator 48 will be.

Referring now to FIGS. 6A to 6E, there will be described the operation of the sampled signal generation circuit shown in FIGS. 3 to 5.

Figure 6A:
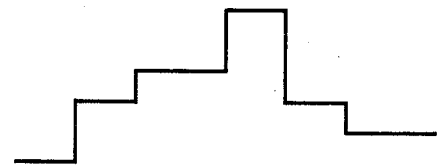
FIGS. 6A to 6E show signal waveforms for illustrating the operation of the sampled signal generation circuit shown in FIGS. 3 to 5.
Figure 6B:
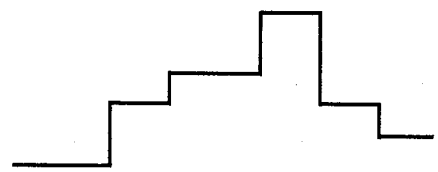
Figure 6C:
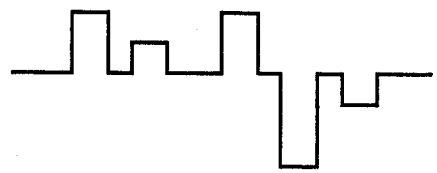
Figure 6D:
Figure 6E:
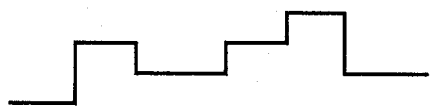

Suppose now that an output signal as shown in FIG. 6A is generated from the sample and hold circuit 10. The output signal of FIG. 6A is sampled by the sample and hold circuit 16 in accordance with the clock pulses CP1 from the clock pulse generator 18, and an output signal as shown in FIG. 6B is generated from the sample and hold circuit 16. The difference between the output signals from these sample and hold circuits 10 and 16 is calculated by the adder 20, and an output signal as shown in FIG. 6C is generated from the adder 20. The output signal from the adder 20 is converted by the absolute value circuit 24 into a signal with, for example, positive polarity as shown in FIG. 6D, and then sampled by the sample and hold circuit 22 in accordance with the clock pulses CP2 from the clock pulse generator 18. Thus, an output signal from the sample and hold circuit 22 represents the difference between the two successive sampled signals from the sample and hold circuit 10 as shown in FIG. 6E.

The output signal $\Delta SD_i$ from the sample and hold circuit 22 is multiplied by the coefficient K in the multiplier 26, and the product is added to the reference voltage $V_{REF}$ in the adder 30. As a result, an output signal $(V_{REF}+K\cdot\Delta SD_i)$ is generated from the adder 30. The output signal from the adder 30 is applied as a control voltage $V_C$ to the VCO 12. Since K is set to a negative value, the value of the control voltage $V_C$ decreases as the value of the output signal $\Delta SD_i$ from the sample and hold circuit 22 increases, and the lower the control voltage $V_C$, the higher the pulse rate at which the output pulses are generated from the VCO 12 will be. Thus, the sample and hold circuit 10 samples and holds the analog-input signal at shorter sampling intervals.

Figure 7:
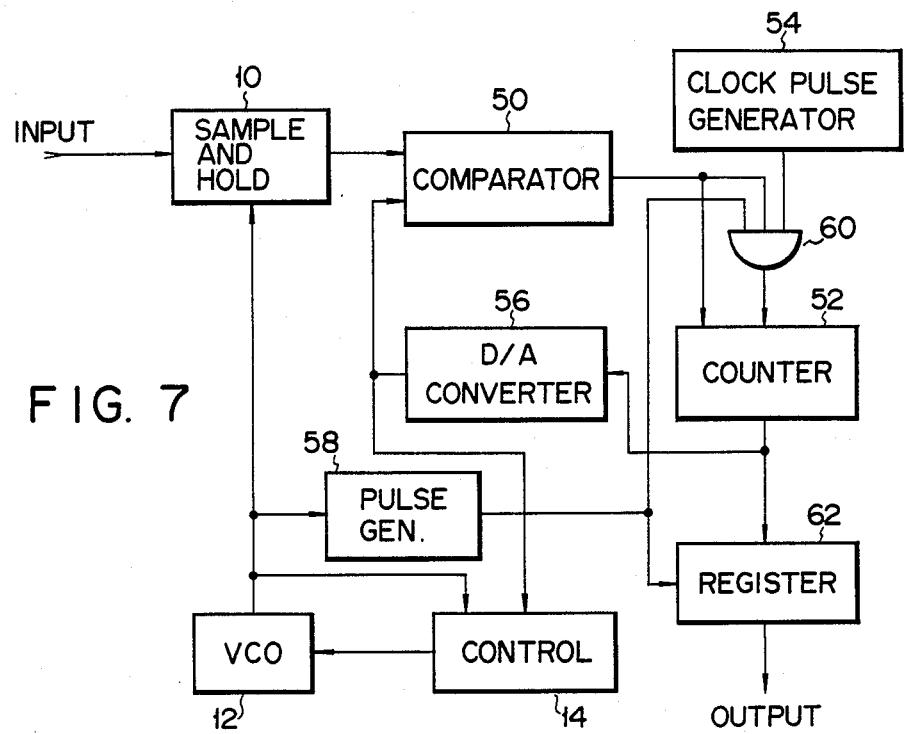
FIG. 7 is a circuit diagram of an A/D converting circuit according to another embodiment of the invention.

FIG. 7 shows an A/D converting circuit utilizing the sampled signal generation circuit shown in FIG. 3. The A/D converting circuit includes a comparator 50 with a first input terminal coupled to the output terminal of the sample and hold circuit 10, a counter 52 for counting high-frequency clock pulses from a clock pulse generator 54, and a local D/A converter 56 for converting output count data from the counter 52 into an analog signal to supply a second input terminal of the comparator 50 with the analog signal. The output terminal of the D/A converter 56 is coupled to the control circuit 14.

A pulse generator 58 supplies to an AND gate 60 output pulses with predetermined pulse width in response to the output pulses from the VCO 12, thereby controlling the AND gate 60. The AND gate 60 is controlled also by the comparator 50 which produces a high-level output signal when it detects that the output signal from the sample and hold circuit 10 is higher than the output signal from the D/A converter 56. Namely, the AND gate 60 allows the clock pulses from the clock pulse generator 54 to be supplied to the counter 52 only while both the comparator 50 and the pulse generator 58 are producing high-level signals. The output data of the counter 52 is set into a register 62 when the trailing edge of the output pulse from the pulse generator 58 is produced, and thereafter the counter 52 is cleared in response to the leading edge of an output pulse from the comparator 50.

Now there will be described the operation of the A/D converting circuit shown in FIG. 7.

When a sampling pulse is generated from the VCO 12, the sample and hold circuit 10 samples and holds an analog input signal to supply an output signal to the comparator 50, thereby causing a high-level output signal to be generated from the comparator 50. At this time, the pulse generator 58 produces a high-level output signal in response to a sampling pulse from the VCO 12. As a result, the clock pulse from the clock pulse generator 54 is supplied to the AND gate 60 to control the counting operation of the counter 52. The output data of the counter 52 is supplied to the local D/A converter 56 which applies an analog signal corresponding to the output data of the counter 52 to the second input terminal of the comparator 50. When the counting operation of the counter 52 advances to cause a stepwise analog signal from the D/A converter 56 to be higher than the output signal from the sample and hold circuit 10, the comparator 50 produces a low-level signal. Consequently, the AND gate 60 is disabled, and interrupts the supply of the clock pulse from the clock pulse generator 54 to the counter 52. Thereafter, the register 62 receives the output data of the counter 52 in response to the trailing edge of the pulse from the pulse generator 58. In other words, the register 62 stores digital data corresponding to the analog input signal sampled and held by the sample and hold circuit 10. Thereafter, the counter 52 is cleared in response to the leading edge of the next pulse from the comparator 50.

Also, the stepwise analog output signal of the local D/A converter 56 is supplied to the control circuit 14, and the next sampling timing is determined by supplying the control voltage $V_C$ to the VCO 12 in the same manner as described with reference to FIG. 4. Thus, the sample and hold circuit 10 samples and holds the analog input signal in response to the sampling pulses generated from the VCO 12 at a frequency controlled by the control voltage from the control circuit 14. Then, the register 62 stores digital data corresponding to the analog signal sampled by the sample and hold circuit 10.

Figure 8:
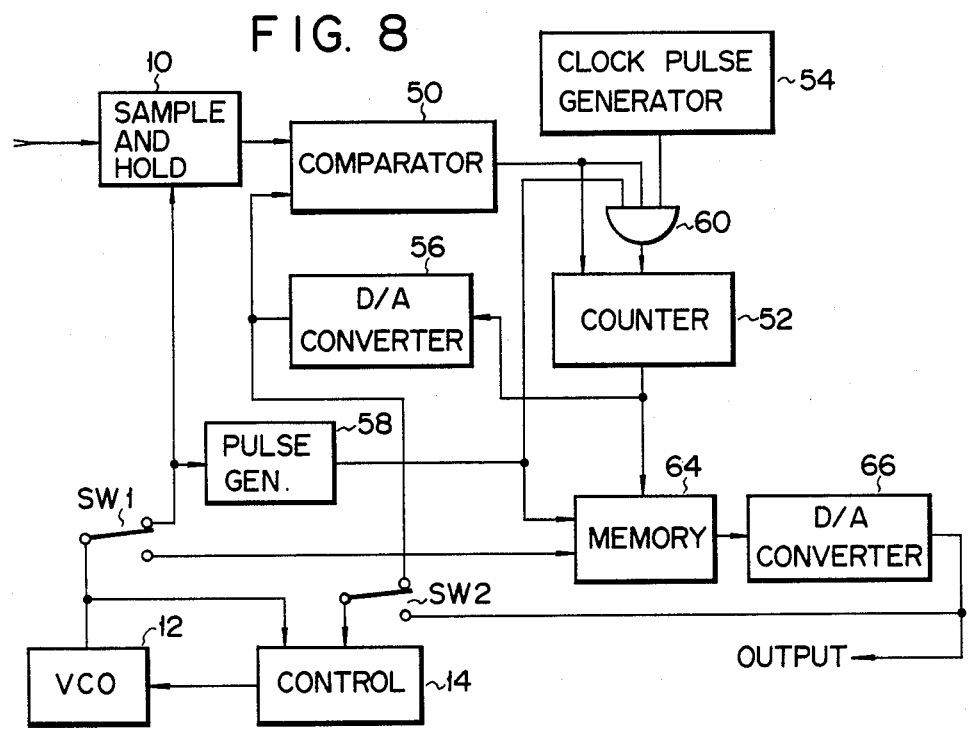
FIG. 8 is a circuit diagram of an analog signal storing circuit according to still another embodiment of the invention.

FIG. 8 shows an analog signal storing circuit utilizing the sampled signal generation circuit shown in FIG. 3.

This analog signal storing circuit basically has the same construction as that of the circuit shown in FIG. 7, except that it includes a memory circuit 64 for storing the count data from the counter 52 in response to the output pulses from the VCO 12, and a D/A converter 66 for converting a digital signal read out from the memory circuit 64 into a stepwise analog signal to supply an output signal to the control circuit 14.

Switches SW1 and SW2 are set in their respective first positions as shown in FIG. 8 when the storing circuit is in write-in xode. In this case, the storing circuit of FIG. 8 operates substantially in the same manner as the circuit of FIG. 7, except that the memory circuit 64 is substituted for the register 62. Namely, the VCO 12 produces sampling pulses at a frequency controlled by the control voltage $V_C$ from the control circuit 14, and the sample and hold circuit 10 samples and holds the analog input signal in response to the sampling pulses from the VCO 12. The counter 52 produces count data corresponding to the sampled signal from the sample and hold circuit 10, and the count data is written into the memory circuit 64 every time the trailing edge of the pulse from the pulse generator 58 is produced.

When the analog signal storing circuit is in readout mode, on the other hand, the switches SW1 and SW2 are set in their respective second positions. Namely, the output terminal of the VCO 12 is coupled to the read terminal of the memory circuit 64 through the switch SW1, and the output terminal of the D/A converter 66 is coupled to the input terminal of the control circuit 14 through the switch SW2.

In the readout mode, data stored in the memory circuit 64 are successively read out in response to the output pulses from the VCO 12. Each data read out from the memory circuit 64 is converted into a stepwise analog signal by the D/A converter 66, and then supplied to the control circuit 14. The control circuit 14 supplies to the VCO 12 a control signal corresponding to the difference between two stepwise signal components received successively, thereby causing the VCO 12 to produce sampling pulses at a frequency controlled in accordance with the difference between these two successive stepwise signal components. Thus, readout pulses are supplied from the VCO 12 to the read terminal of the memory circuit 64 in the same timing relationships as those of the sampling pulses supplied from the VCO 12 to the sample and hold circuit 10 in the write-in mode. As a result, a stepwise analog signal corresponding to the analog input signal supplied to the sample and hold circuit 10 is generated from the D/A converter 66 which converts the digital data read out from the memory circuit 64 into an analog signal. The input analog signal is restored by filtering the stepwise analog signal of the D/A converter 66.

Figure 9:
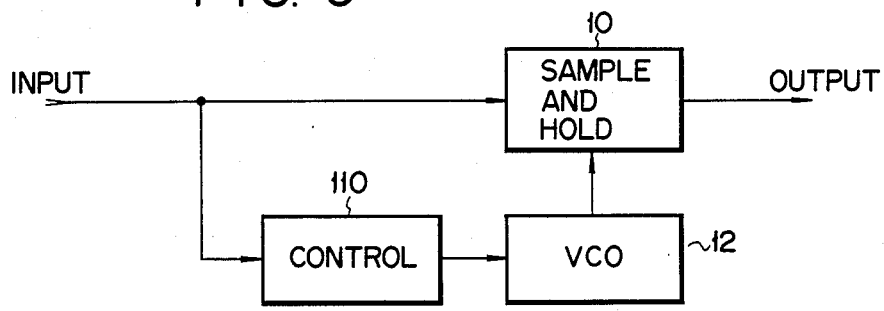
FIG. 9 is a block diagram of a sampled signal generation circuit according to a further embodiment of the invention.

FIG. 9 shows a sampled signal generation circuit according to a further embodiment of this invention.

This sampled signal generation circuit includes a sample and hold circuit 10 for sampling and holding an analog input signal in response to sampling pulses from a VCO 12, and control circuit 110 for detecting the gradient of the analog input signal and supplying to the VCO 12 an output voltage of a level corresponding to the absolute value of the gradient as a control voltage. The control circuit 110 controls the VCO 12 so that the sampling pulses may be generated therefrom at a high pulse rate when the gradient of the analog input signal is sharp. Accordingly, the greater the rate of change of the analog input signal, the higher the speed at which the sample and hold circuit 10 samples the analog input signal will be.

Figure 10:
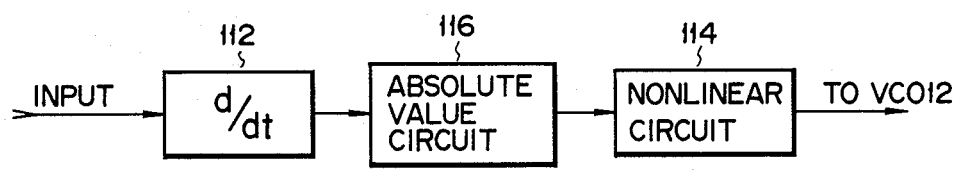
FIG. 10 is a detailed block diagram of a control circuit used in the sampled signal generation circuit shown in FIG. 9.
Figure 11:
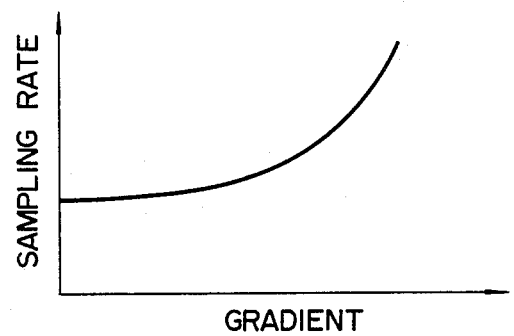
FIG. 11 shows an input-output characteristic curve of a nonlinear circuit used in the control circuit shown in FIG. 10.

As shown in FIG. 10, for example, the control circuit 110 includes a differentiation circuit 112 for differentiating the analog input signal, and a nonlinear circuit 114 receiving an output signal from the differentiation circuit 112 through an absolute value circuit 116 and nonlinearly amplifying the input signal. The existence of the nonlinear circuit 114 causes the VCO 12 to produce the sampling pulses at a sampling rate which monotonously increases with the increase of the gradient of the analog input signal and increases with a sharper gradient in a region where the gradient of the analog input signal is sharp than in a region where such gradient is gentle. This is done because, where the gradient of the analog input signal is sharp, sufficient number of sampled data to represent with high fidelity the analog input signal changing at a high changing rate are obtained by increasing the sampling frequency at a higher rate.

Figure 12:
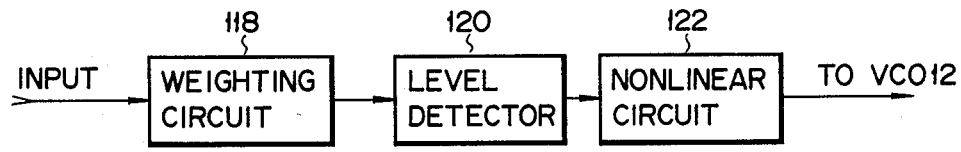
FIG. 12 shows another example of the control circuit used in the sampled signal generation circuit shown in FIG. 9.

In an analog signal with limited frequency band, there is a correlation between the amplitude and the average of the absolute values of gradient. To sample such an analog signal, the control circuit 110 can be composed of a weighting circuit 118 for emphasizing the high frequency component of an input signal, a level detector 120 for detecting the level of the output signal of the weighting circuit 118, and a nonlinear circuit 122 for nonlinearly amplifying the output signal of the level detector 120 as shown in FIG. 12.

Figure 13:
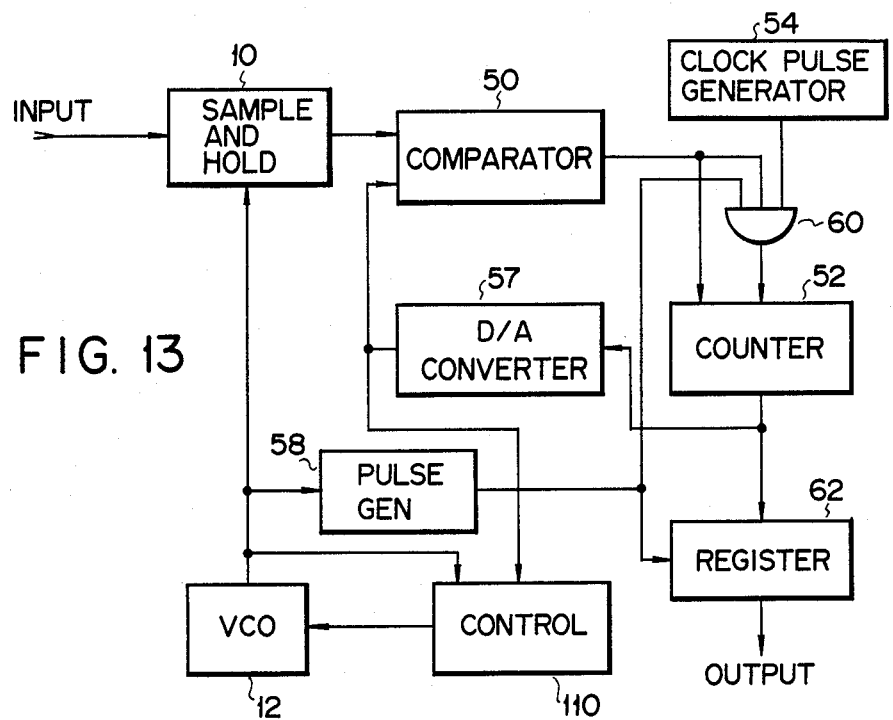
FIG. 13 is a circuit diagram of an A/D converting circuit according to another embodiment of the invention.

FIG. 13 shows an A/D converting circuit according to a further embodiment of this invention. This A/D converting circuit is constructed and operates in the same manner as the one shown in FIG. 7, except that a D/A converter 57 converts output data from the counter 52 into a filtered analog signal, and that a control circuit 110 supplies to the VCO 12 an output voltage corresponding to the gradient of the analog output signal from the D/A converter 57. This embodiment provides the same effect as obtained in the embodiment of FIG. 7.

Figure 14:
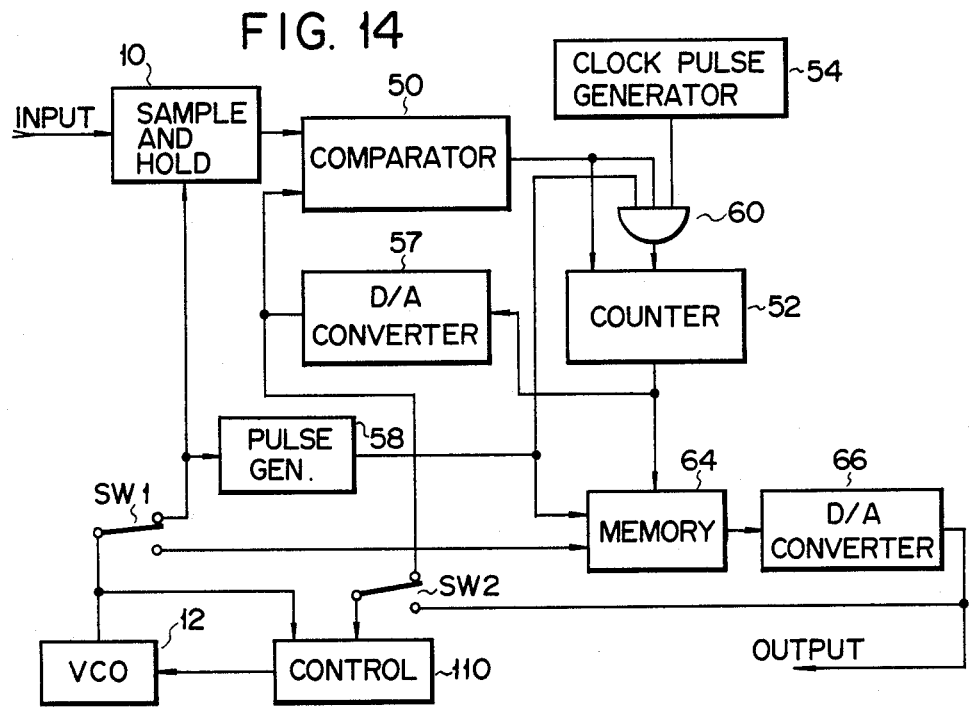
FIG. 14 is a circuit diagram of an analog signal storing circuit according to still another embodiment of the invention.

FIG. 14 shows an analog signal storing circuit according to another embodiment of this invention. This analog signal storing circuit is constructed and operates in the same manner as the one shown in FIG. 8, except that the D/A converter 57 converts output data from the counter 52 into a filtered analog signal, and that the control circuit 110 supplies to the VCO 12 an output voltage corresponding to the gradient of the analog output signal from the D/A converter 57. This embodiment attains the same effect as obtained in the embodiment of FIG. 8.

Figure 15:
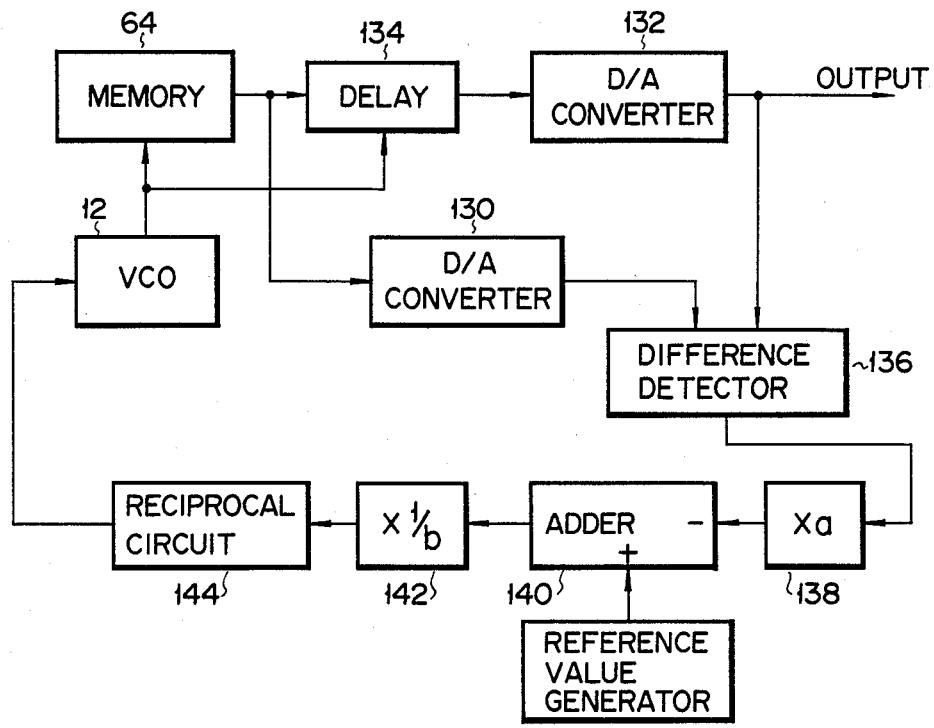
FIG. 15 is a block diagram of a sampled data generation circuit according to a further embodiment of the invention.

FIG. 15 shows a sampled data generation circuit according to a further embodiment of this invention. In this generation circuit, a memory circuit 64 stores sampled data corresponding to the analog input signal in the write-in mode of the storing circuit shown in FIG. 14, for example. The memory circuit 64 is supplied with pulses generated from the VCO 12. The data successively read out from the memory circuit 64 are supplied to a D/A converter 130, and also to a D/A converter 132 through a delay circuit 134 which delays the input signal by one readout period in response to output pulses from the VCO 12. Output data $SD_{(n+1)}$ and $SD_n$ from these D/A converters 130 and 132 are supplied to a difference detector 136, which produces an output data $\Delta SD_n$ $(=|SD_{(n+1)}-SD_n|)$. The output data $\Delta SD_n$ from the difference detector 136 is multiplied by a in a coefficient circuit 138, and the product is subtracted from "1" in an adder 140. Output data $(1-a\Delta SD_n)$ from the adder 140 is multiplied by 1/b in a coefficient circuit 142, and the product is caused to reciprocate in a reciprocal circuit 144. Output data $(b/1-a\Delta SD_n)$ generated from the reciprocal circuit 144 and corresponding to equation (5) is supplied as a control voltage $V_C$ to the VCO 12. Thus, sampled data accompanied with time information are read out from the memory circuit 64, and an analog signal corresponding to the analog input signal is generated from the D/A converter 130 or 132.

Although illustrative embodiments of this invention have been described in detail herein, it is to be understood that the invention is not limited to those precise embodiments.

Figure 16:
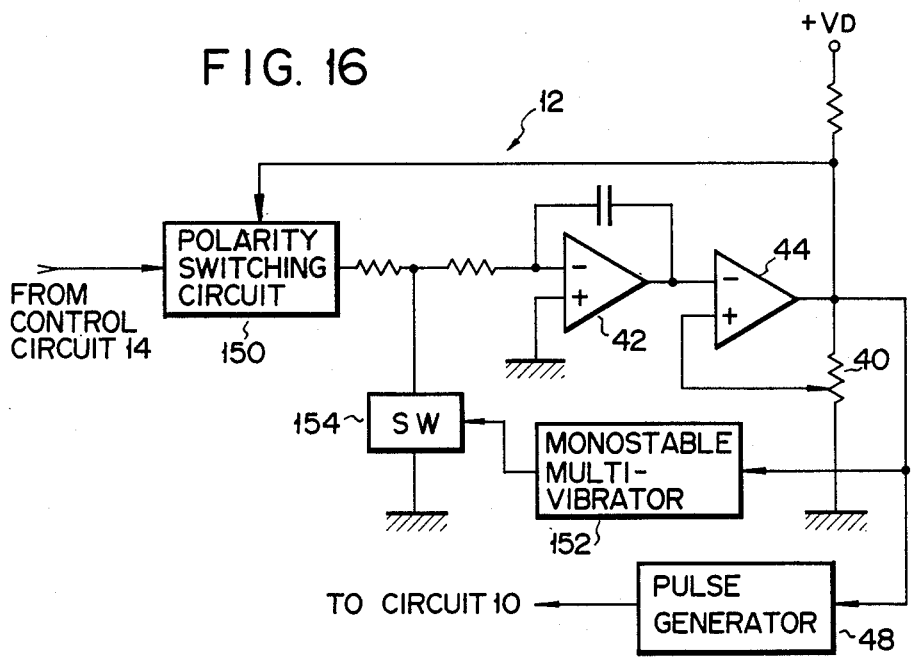
FIG. 16 is a circuit diagram of a voltage controlled oscillator capable of being substituted for the one shown in FIG. 5.

For example, it is possible to use a suitable VCO, such as one shown in FIG. 16 for the VCO 12, instead of the VCO shown in FIG. 5 which is used in the above embodiments to obtain the sampling timing given by eq. (1). In the VCO shown in FIG. 16, the output terminal of a polarity switching circuit 150 is coupled to the inverted input terminal of the integration circuit 42, and the output terminal of the voltage divider 40 is coupled to the positive input terminal of the comparator 44 whose negative input terminal is connected with the output terminal of the integration circuit 42. The output terminal of the comparator 44 is coupled to the pulse generator 48, and also to a monostable multivibrator 152 which produces a pulse with a predetermined pulse width every time the level of the output signal from the comparator 44 changes. A switch 154 is closed in response to the output pulse from the monostable multivibrator 152.

In the VCO shown in FIG. 16, when the output voltage of the comparator 44 is $+V_D$, the polarity switching circuit 150 inverts the control voltage $V_C$ from the control circuit 14, and supplies the integration circuit 42 with an output voltage $-V_C$, thereby gradually increasing the output voltage of the integration circuit 42. When the output voltage of the integration circuit 42 becomes higher than that of the voltage divider 40, the output voltage of the comparator 44 becomes $-V_D$. As a result, the pulse generator 48 supplies an output pulse to the sample and hold circuit 10, and an output pulse with the predetermined pulse width is generated from the monostable multivibrator 152 to close the switch 154. Thus, the integration circuit 42 may hold the current output voltage for a predetermined period of time. Namely, the interval of the sampling pulses from the VCO of FIG. 16 depends on the sum of a predetermined constant time component and a time component in inverse proportion to the absolute value of the control voltage $V_C$ from the control circuit 14, satisfying eq. (2).

Further, the control circuit 14 is connected so as to receive the output data from the D/A converter 56 in the embodiment shown in FIG. 7, for example. Instead of doing this, however, the control circuit 14 may be connected so as to receive the output data from the sample and hold circuit 10.

In the storing circuits shown in FIGS. 8 to 14, for example, the digital memory circuit 64 may be replaced with an analog memory, such as a CCD memory or BBD memory, so that the output data from the sample and hold circuit 10 may be stored directly in the analog memory.

In the embodiment shown in FIG. 13, moreover, the control circuit 110 is connected so as to receive the output data from the D/A converter 57. Alternatively, however, the control circuit 110 may be connected so as to receive the output data from the sample and hold circuit 10.

Furthermore, sampled data can be transmitted without losing the time information therefor by supplying the digital data from the register 62 in FIG. 7 or 13 to a D/A converter 160 by means of a transmission line 162 so that the D/A converter 160 may be driven in accordance with sampling pulses transmitted from the VCO 12 by means of another transmission line 164, as shown in FIG. 17.

The VCO 12 and the control circuit 14 or 110 are used in the write-in and readout modes in the embodiments shown in FIGS. 8 and 14. Alternatively, the circuit may be so arranged that the VCO 12 and the control circuit 14 or 110 are used only in the write-in mode, and the data may be read out from the memory circuit 64 by the use of a VCO 166 and a control circuit 168 separately provided as shown in FIG. 18.

Further, the differentiation circuit 112 shown in FIG. 10, which is to differentiate the analog signal, may be replaced with a gradient detecting circuit which samples the input analog signal and detects the gradient of the input analog signal from the difference between two successive sampled data and the sampling interval. In this case, the control circuit 110 can be replaced by a control circuit which detects the gradient of the input analog signal on the basis of two successive sampled data from the sample and hold circuit 10 and the sampling interval, and supplies the VCO 12 with an output signal corresponding to the detected gradient, thereby controlling the oscillation frequency of the VCO 12.

What we claim is:

1. An analog-digital converting circuit comprising:
   signal generating means for producing an output signal with a frequency variable according to a control signal;
   samping means for sampling an analog input signal in response to the output signal from said signal generating means;
   analog-digital converting means for converting analog data sampled by said sampling means into a digital signal;
   local digital-analog converting means for converting an output signal from said analog-digital converting means into an analog signal; and
   control means for detecting the gradient of an output signal from said local digital-analog converting means and supplying to said signal generating means an output signal corresponding to said gradient as said control signal, thereby controlling said signal generating means to increase or decrease the frequency of the output signal from said signal generating means according as said gradient becomes larger or smaller.

2. An analog-digital converting circuit according to claim 1, wherein said signal generating means is formed of a voltage controlled oscillator with a frequency controlled in accordance with the control signal generated from said control means.

3. An analog-digital converting circuit according to claim 1 or 2, further comprising a memory circuit for successively storing digital signals from said analog-digital converting means in response to the output signal from said signal generating means.

4. An analog-digital converting circuit according to claim 1, wherein said control means includes a differentiation circuit for differentiating an output signal from said local digital-analog converting means.

* * * * *